United States Patent
Pavier et al.

(10) Patent No.: US 7,547,964 B2
(45) Date of Patent: Jun. 16, 2009

(54) DEVICE PACKAGES HAVING A III-NITRIDE BASED POWER SEMICONDUCTOR DEVICE

(75) Inventors: Mark Pavier, Feldbridge (GB); Norman Glyn Connah, Glossop (GB)

(73) Assignee: International Rectifier Corporation, El Segundo, CA (US)

(*) Notice: Subject to any disclaimer, the term of this patent is extended or adjusted under 35 U.S.C. 154(b) by 376 days.

(21) Appl. No.: 11/410,457

(22) Filed: Apr. 24, 2006

(65) Prior Publication Data

US 2006/0237825 A1 Oct. 26, 2006

Related U.S. Application Data

(60) Provisional application No. 60/674,616, filed on Apr. 25, 2005.

(51) Int. Cl.
*H01L 23/52* (2006.01)

(52) U.S. Cl. .................. 257/691; 257/676; 257/706; 257/796; 257/E23.042

(58) Field of Classification Search ............... 257/666, 257/676, 686, 691, 706, 796, E23.024, E23.042, 257/E23.052
See application file for complete search history.

(56) References Cited

U.S. PATENT DOCUMENTS

| | | | |
|---|---|---|---|
| 6,255,722 B1 | 7/2001 | Ewer et al. | |
| 6,380,569 B1 | 4/2002 | Chang et al. | |
| 6,404,065 B1 | 6/2002 | Choi | 257/782 |
| 6,545,364 B2 | 4/2003 | Sakamoto et al. | |
| 6,597,063 B1 | 7/2003 | Shimizu et al. | |
| 6,762,488 B2 | 7/2004 | Maeda et al. | |
| 6,798,060 B2 | 9/2004 | Strauch | 257/705 |
| 2002/0041003 A1* | 4/2002 | Udrea et al. | 257/502 |
| 2003/0162382 A1* | 8/2003 | Aono et al. | 438/617 |
| 2004/0080028 A1* | 4/2004 | Yanagisawa | 257/675 |
| 2005/0012541 A1 | 1/2005 | Watanabe | |
| 2005/0133902 A1* | 6/2005 | Pavier et al. | 257/691 |
| 2005/0151236 A1* | 7/2005 | Oliver et al. | 257/685 |

OTHER PUBLICATIONS

International Search Report dated Aug. 30, 2007 for PCT/US06/15376.
International Search Report dated Aug. 8, 2006 for PCT/US06/15377.

* cited by examiner

*Primary Examiner*—M. Wilczewski
*Assistant Examiner*—Telly D Green
(74) *Attorney, Agent, or Firm*—Ostrolenk, Faber, Gerb & Soffen, LLP

(57) ABSTRACT

A semiconductor device package includes a die pad, a substrate disposed on the die pad, and a III-nitride based semiconductor device disposed on the substrate. The device package may also include a second semiconductor device disposed on the die pad or the substrate, which device may be electrically connected to the III-nitride based device to form a circuit.

12 Claims, 4 Drawing Sheets

DEVICE PACKAGES HAVING A III-NITRIDE BASED POWER SEMICONDUCTOR DEVICE

RELATED APPLICATIONS

This application is based on and claims priority to U.S. Provisional Application No. 60/674,616, filed on Apr. 25, 2005, by Glyn Connah et al., entitled, "SEMICONDUCTOR PACKAGE," the contents of which are herein incorporated by reference.

BACKGROUND OF THE INVENTION

1. Field of the Invention

This invention relates to semiconductor device packages and more specifically, relates to semiconductor device packages that include a III-nitride based power semiconductor device.

2. Description of the Art

III-nitride based power semiconductor devices, such as Gallium Nitride (GaN) based devices, are desirable for power applications. Example III-nitride based devices include diodes, unidirectional switches, and bi-directional switches. These devices are lateral conductive devices with the power electrodes and control electrodes disposed along a top surface of the devices and with the bottom surface of the devices being electrically non-conductive.

For example, referring to FIG. 1A there is shown a top view of a III-nitride unidirectional switching device 10. Device 10 includes a drain electrode 22 and a source electrode 23, which are arranged as interdigitated portions. As shown, the device may include elongated runners 21 and 24 that extend along respective edges of the device. Runner 21 is connected to the interdigitated portions of drain electrode 22 and runner 24 is connected to the interdigitated portions of source electrode 23. Wire bonds may be formed to the runners to interface with the electrodes. The device also includes a gate electrode 20 formed in a serpentine shape between drain electrode 22 and source electrode 23.

Similarly, referring to FIG. 1B there is shown a top view of a III-nitride bi-directional switching device 30. Device 30 may have a form as disclosed in U.S. Publication No. US 2005-0189561 (U.S. patent application Ser. No. 11/056,062), entitled "III-Nitride Bidirectional Switch," by Daniel M. Kinzer et al., and assigned to the assignee of the present application. The contents of U.S. Publication No. US 2005-0189561 are hereby incorporated by reference as if fully set forth in its entirety herein.

Device 30 includes first and second power electrodes 25 and 26, which are arranged as interdigitated portions. Again, elongated runners 40 and 42 may be provided, each of which is connected to respective portions of power electrode 25 or power electrode 26. Device 30 also includes first and second gate electrodes 32 and 34, with portions of each electrode being disposed between the power electrodes. Elongated runners 46 and 48 are provided, with runner 46 electrically connecting the portions of gate electrode 32 and runner 48 electrically connecting the portions of gate electrode 34. By controlling each gate electrode, the switch may conduct current in either a forward direction or a reverse direction. Accordingly, either power electrode may serve as the drain or source electrode.

Similarly, for a III-nitride based diode, the device may only include power electrodes.

In general, it is desirable to provide semiconductor device packages for III-nitride based devices, including device packages that co-package III-nitride based devices with other semiconductor devices, including silicon-based devices.

BRIEF SUMMARY OF THE INVENTION

According to an embodiment of the invention, a semiconductor device package includes a lead frame having a die pad and a plurality of terminal leads. The device package also includes a substrate, such as a ceramic tile, having opposing top and bottom surfaces, with the bottom surface being disposed on a top surface of the die pad. The device package further includes a III-nitride based power semiconductor device, such as a GaN-based device, disposed on the top surface of the substrate, which isolates the III-nitride device from the die pad. Electrodes, such as the power electrodes, of the III-nitride device may be electrically connected to the die pad, to one or more pads disposed on the top surface of the substrate, and/or to one or more terminal leads. A protective housing may be formed over the III-nitride device, the substrate, and a portion of the lead frame. According to an embodiment of the invention, the device package may conform to a TO package format, such as a TO-220 package format, although other package formats may be used.

According to an embodiment of the invention, a device package may also include a second semiconductor device, such as a silicon-based device, disposed on either the top surface of the die pad or the top surface of the substrate. Electrodes of the III-nitride device and the second semiconductor device may be interconnected to form a circuit.

According to a preferred embodiment of the invention, a device package includes a III-nitride bi-directional switching device and a silicon-based switching device, such as a MOSFET, and the two devices are interconnected to functionally operate as a single switch. The switch may act as a replacement switch for high voltage switches. Specifically, according to an embodiment of the invention a first power electrode and a first gate electrode of the III-nitride device are electrically connected. In addition, a second power electrode of the III-nitride device is electrically connected to a drain electrode of the MOSFET and a second gate electrode of the III-nitride device is electrically connected to a source electrode of the MOSFET. In this configuration, the gate electrode and the source electrode of the MOSFET act as the gate electrode and the source electrode of the formed high voltage switch, and the first power electrode of the III-nitride device acts as the drain electrode of the high voltage switch.

Other features and advantages of the present invention will become apparent from the following description of the invention, which refers to the accompanying drawings.

DETAIL DESCRIPTION OF THE INVENTION

Figure 1A:
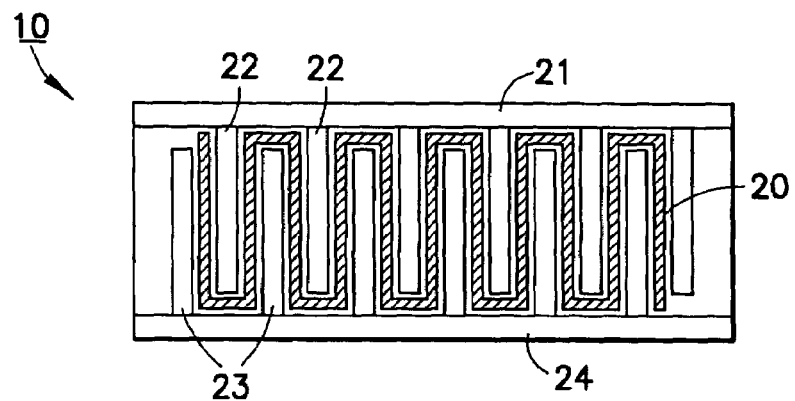
FIG. 1A shows a top view of a III-nitride based unidirectional switching device of the prior art.
Figure 1B:
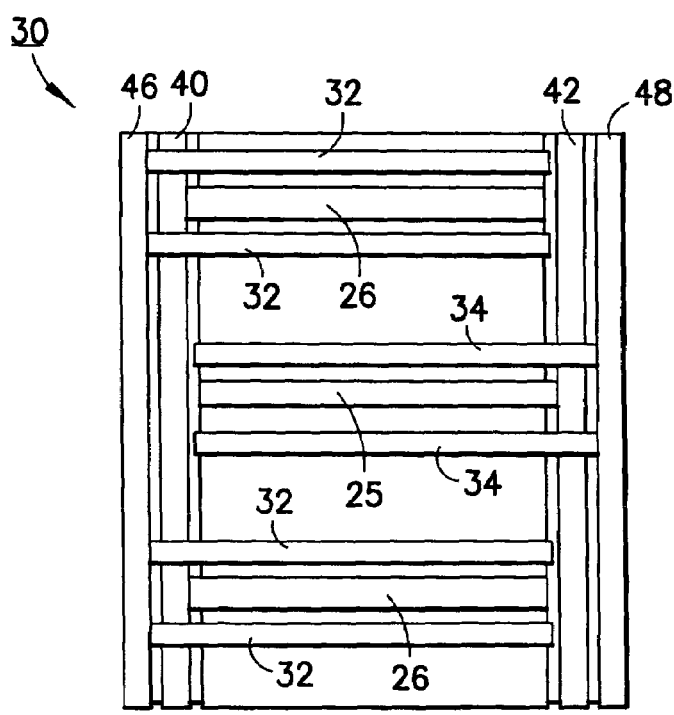
FIG. 1B shows a top view of a III-nitride based bi-directional switching device of the prior art.
Figure 2A:
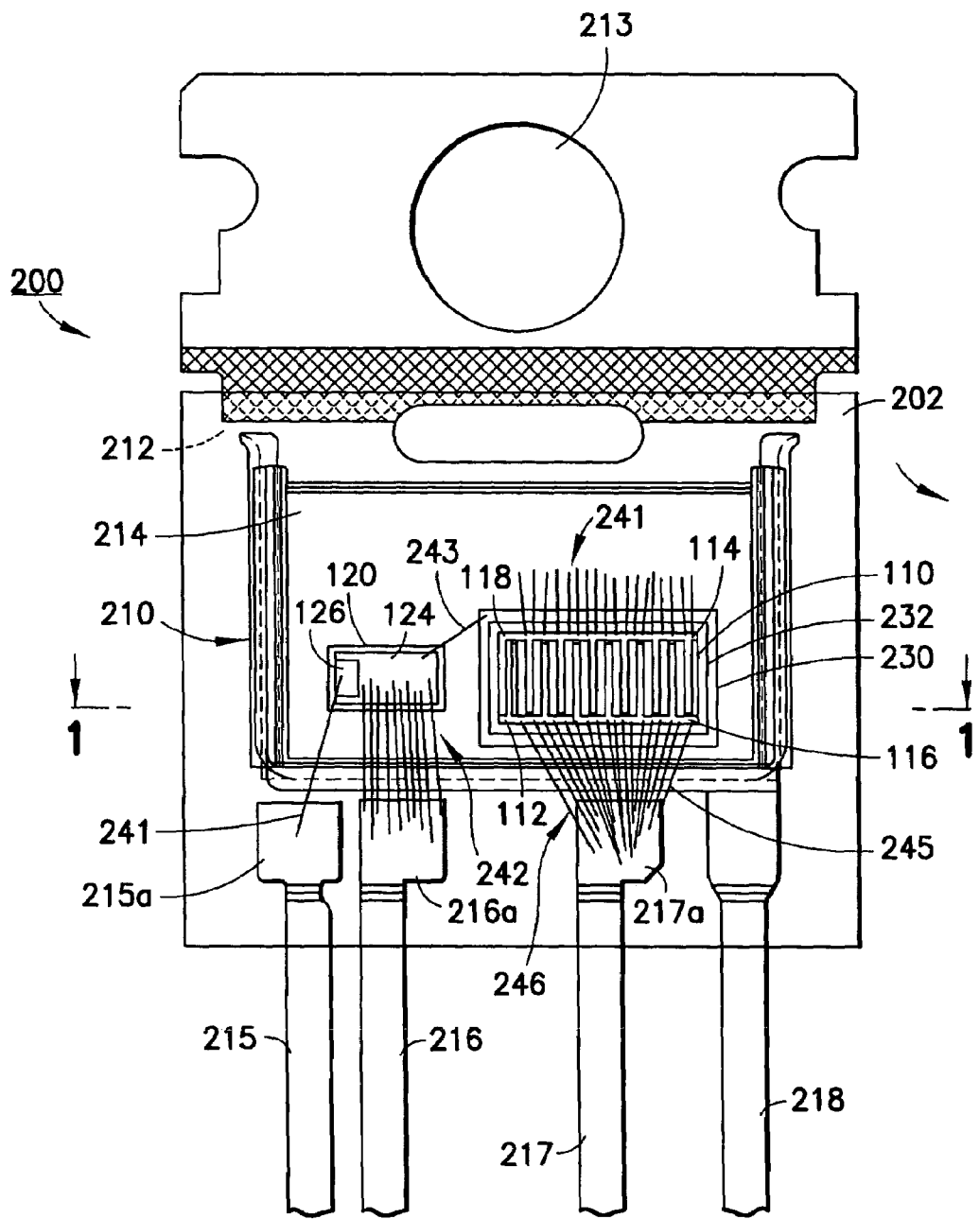
FIG. 2A shows a top view of a semiconductor device package according to an embodiment of the invention.
Figure 2B:
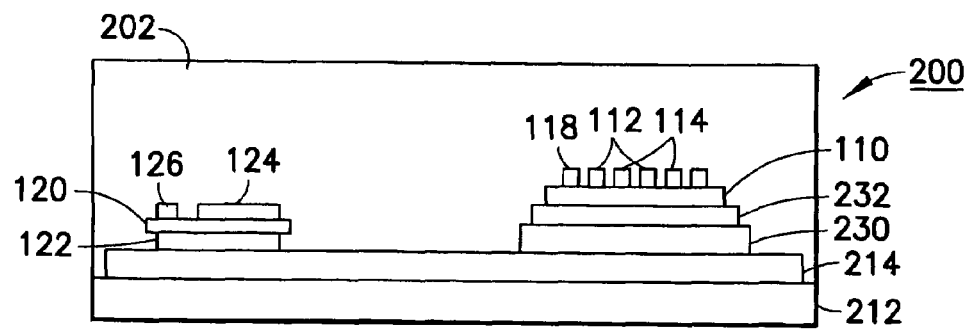
FIG. 2B shows a cross sectional side view of the semiconductor device package of FIG. 2A as seen along line 1, according to an embodiment of the invention.

Referring to FIGS. 2A and 2B, there is shown a top view and a cross sectional side view of a semiconductor device package 200 according to an embodiment of the invention. Note that FIG. 2B is seen along line 1 of FIG. 2A and is not drawn to scale. Device package 200 includes a lead frame 210 having a header 212, a die pad 214 mechanically secured to header 212, and a plurality of terminal leads, such as leads 215, 216, 217, and 218. While device package 200 is shown as having four terminal leads, one skilled in the art will recognize that the package may include more than or fewer than four leads, depending on the configuration of the package, without deviating from the scope and spirit of the present invention.

Device package 200 also includes first semiconductor device 110. Device 110 is a III-nitride based power semiconductor device, such as GaN-based device, although other semiconductor alloys may be used to construct device 110. According to a preferred embodiment of the invention, device package 200 also includes a second semiconductor device 120, which may be a silicon-based power device, although other types of semiconductor devices, including III-nitride based devices, may be used. One skilled in the art will recognize that while device package 200 includes a second semiconductor device, the package may only include device 110 without deviating from the scope and spirit of the invention.

Device package 200 also includes a protective insulating housing 202 positioned over devices 110 and 120 and a portion of lead frame 210. Note that housing 202 is shown as "see through" in FIGS. 2A and 2B.

According to an embodiment of the invention and as shown in FIG. 2A, device package 200 may conform to a TO-220 package format. Accordingly, header 212 may include a mounting hole 213 to secure the package to a heat-sink. Similarly, terminal leads 215, 216, 217, and 218 may be parallel and co-planar with each other and may extend from package 200 along the same edge beyond the outer boundary of insulated housing 202, thereby allowing for external connection to devices 110 and 120. Nonetheless, one skilled in the art will recognize that the present invention is not limited to a TO-220 package format and may conform to other TO formats and more generally, may conform to other through hole package formats. Similarly, a semiconductor device package according to the present invention may conform to a surface mount package format.

Figure 3:
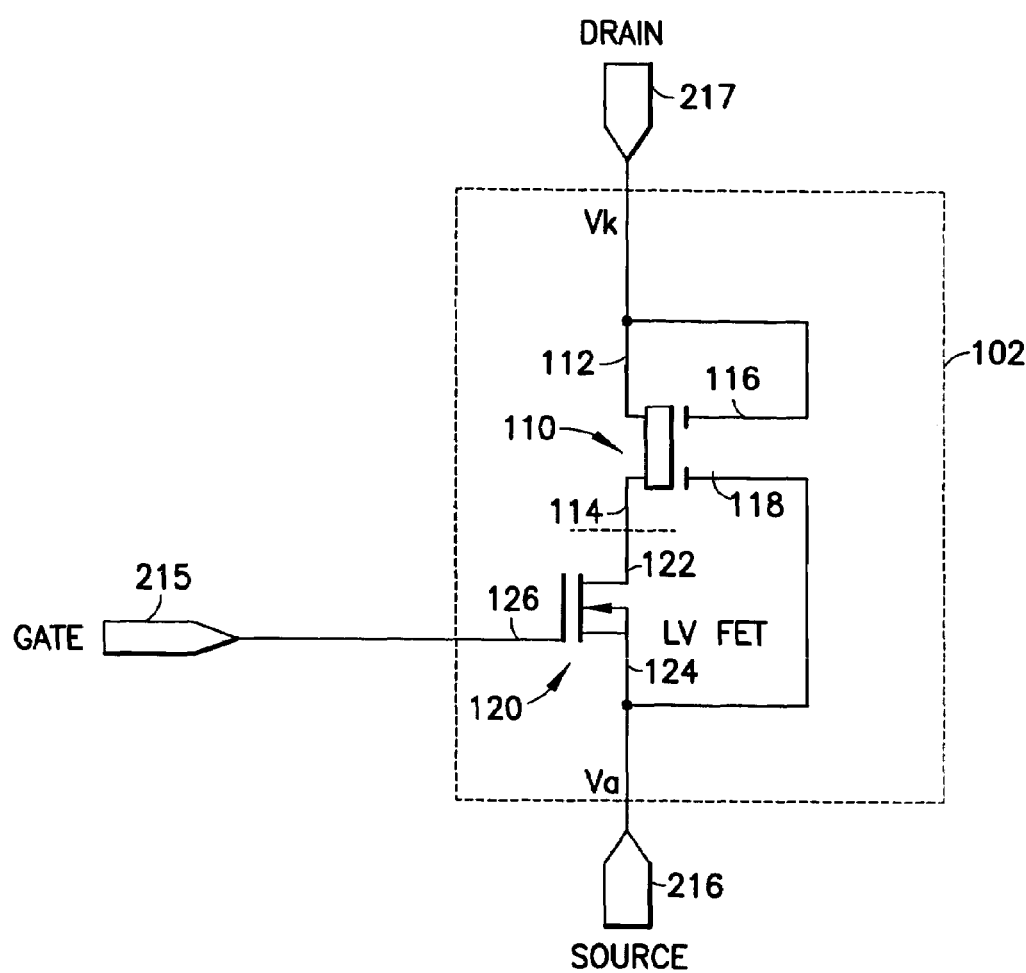
FIG. 3 shows a schematic of a high voltage switch formed by the interconnected devices of the semiconductor device package of FIG. 2A, according to an embodiment of the invention.

Referring to devices 110 and 120, according to an embodiment of the invention these devices may be interconnected to form a circuit. According to a preferred embodiment of the invention device 110 is a bi-directional switching device and device 120 is a vertical conductive switching device, such as a MOSFET, and the two devices are interconnected to operate as a single switch. This switch may function as a replacement switch for high voltage switches, or in other words, switches that may operate from 600V to 1000V, for example. FIG. 3 shows a schematic diagram of interconnected devices 110 and 120, with dotted line/box 102 representing the high voltage switch formed by the two devices.

More specifically, referring to FIGS. 2A, 2B, and 3, device 120 includes source electrode 124 and gate electrode 126 on a top surface thereof and drain electrode 122 on the bottom surface thereof. According to this embodiment of the invention, drain electrode 122 is mounted to die pad 214 using a thermally and electrically conductive adhesive, such as solder or the like. As shown in FIG. 2A, a terminal lead, such as lead 218, may be integral with pad 214 and thereby electrically connected to drain electrode 122. As further shown in the Figures, gate electrode 126 may be electrically connected through wire bond 241 to bond pad 215a of terminal lead 215 and source electrode 124 may be electrically connected through a plurality of wire bonds 242 to bond pad 216a of terminal lead 216. Alternatively, a single large diameter wire bond may be used to connect source electrode 124 to terminal lead 216. Wire bonds 241 and 242 may be formed of gold or aluminum, for example.

Referring to device 110, as indicated, this device is a III-nitride bi-directional switching device and includes first and second power electrodes 112/114 and first and second gate electrodes 116/118 on a top surface thereof. According to an embodiment of the invention and as shown in FIGS. 2A and 2B, device package 200 also includes an insulating substrate 230 that operates to electrically isolate device 110 from die pad 214. More specifically, according to this embodiment of the invention, substrate 230 includes a conductive pad 232 disposed on the top surface thereof. Device 110 is mounted to pad 232 using a thermally conductive adhesive, such as solder, and in particular, is mounted with its active area facing upward, thereby exposing electrodes 112-118 along the top surface of the device. In turn, the bottom surface of substrate 230 is mounted to the top surface of die pad 214 using a thermally conductive adhesive. In this way, substrate 230 electrically isolates device 110 from die pad 214.

Substrate 230 preferably has good thermal conductivity so that the heat generated by device 110 is transferred to lead frame 210. According to a preferred embodiment of the invention, substrate 230 is a ceramic substrate, such as an aluminum based ceramic like alumina. Nonetheless, one skilled in the art will recognize that other insulating substrates may be used. For example, pad 232 and substrate 230 may be an insulated metal substrate (IMS).

As shown in FIGS. 2A and 3, according to this embodiment of the invention second power electrode 114 of device 110 may be electrically connected through a plurality of wire bonds 244 to die pad 214 and thereby to drain electrode 122 of device 120. Similarly, second gate electrode 118 may be electrically connected through wire bond 243 to source electrode 124 of device 120. First power electrode 112 of device 110 may be electrically connected through a plurality of wire bonds 246 to bond pad 217a of terminal lead 217. Similarly, first gate electrode 116 of device 110 may also be electrically connected through wire bond 245 to bond pad 217a, thereby electrically connecting gate electrode 116 to power electrode 112.

One skilled in the art will recognize that device package 200 is not limited to the electrode-to-terminal lead assignments as shown in FIG. 2A and other configurations may be used without deviating from the scope and spirit of the invention. For example, device package 200 may include an additional terminal lead, and power electrode 116 of device 110 may also be connected to this additional lead through a plurality of wire bonds, thereby electrically connecting power electrode 116 to multiple terminal leads.

As indicated above, according to this embodiment of the invention devices 110 and 120 are interconnected to functionally operate a single high voltage switch 102. In particular, terminal lead 215 may act as the gate lead for switch 102, terminal lead 217 may act as the drain lead for switch 102, and terminal lead 216 may act as the source lead for switch 102. Notably, devices 110 and 120 of switch 102 also perform the body diode function.

One skilled in the art will recognize that device package 200 is not limited to the devices as described above and is not limited to a circuit configuration that operates as a high voltage switch as described above, and other devices and circuit configurations may be used without deviating from the scope and spirit of the invention. For example, device 120 may be lateral conductive silicon based device, may be a device other than a switch, such as a diode, and may be a III-nitride based device. Similarly, device 110 is not limited to a III-nitride bi-directional switch and may be a unidirectional switch or diode, for example.

Referring now to protective insulating housing 202, this housing may be formed from any suitable material known in the art, such as plastic. As shown in FIGS. 2A and 2B, this housing may extend over at least a portion of the top surface of lead frame 210, covering devices 110 and 120, substrate 230, and a portion of terminal leads 215-218. As shown in FIG. 2B, the housing may not extend over the bottom surface of the lead frame, so that this surface may directly contact a heat sink. Alternatively, the housing may be over-molded such that the housing extends over at least a portion of the bottom surface of lead frame 210, thereby enabling electrical isolation.

Figure 4:
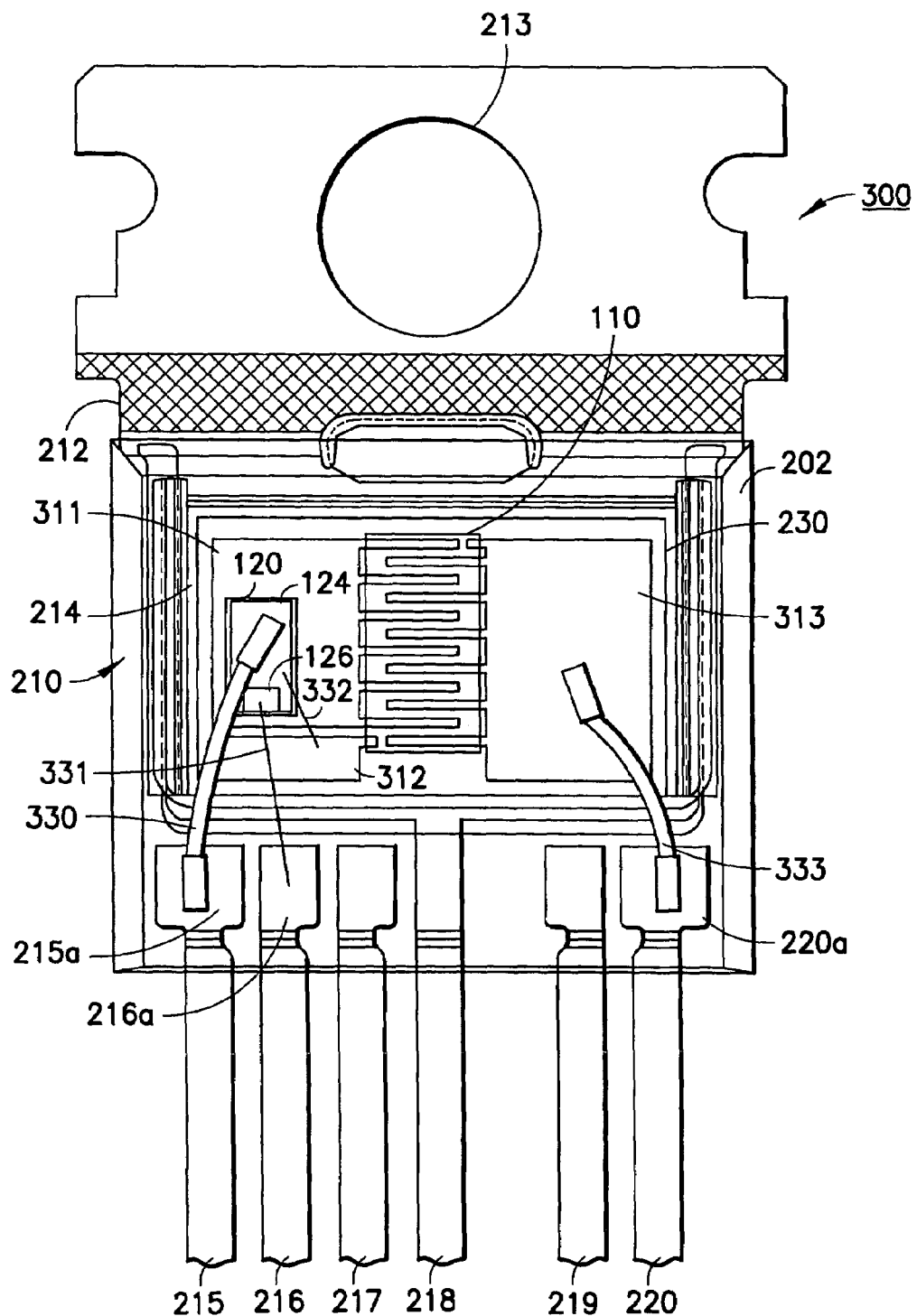
FIG. 4 shows a top view of a semiconductor device package according to another embodiment of the invention.

Referring now to FIG. 4, there is shown a top view of a semiconductor device package 300 according to another embodiment of the invention. Device package 300 is similar to device package 200 and includes a lead frame 210 having a header 212, a die pad 214, and a plurality of terminal leads, such as leads 215-220. While device package 300 is shown as having six terminal leads, one skilled in the art will recognize that take package may include more than or fewer than six leads, depending on the configuration of the package, without deviating from the scope and spirit of the present invention. One skilled in the art will also recognize that while device package 300 is shown as a TO-220 package format, the device package may conform to other package formats.

Device package 300 also includes a substrate 230 mounted to the top surface of die pad 214 and includes first and second semiconductor devices 110 and 120. According to this embodiment of the invention, however, substrate 230 now includes a plurality of pads, such as pads 311-313, on the top surface thereof and both devices 110 and 120 are mounted to the pads of the substrate. One skilled in the art will recognize that the number, shape, and/or configuration of substrate pads 311-313 as shown in FIG. 4 may vary, depending on the devices and the configuration of the devices of the package, without deviating from the scope and spirit of the invention.

According to this embodiment of the invention, devices 110 and 120 are a bi-directional switch and a silicon-based vertical conductive switch, respectively, as described above and the devices are interconnected to operate as a high voltage switch 102. One skilled in the art will recognize, however, that other devices and other circuit configurations are possible without deviating from the scope and spirit of the invention. One skilled in the art will also recognize that device package 300 may only include device 110 without deviating from the scope and spirit of the invention.

As shown in FIG. 4, according to this embodiment of the invention device 110 is mounted to substrate 230 in a flip-chip orientation such that electrodes 112-118 on the top surface of the device directly contact substrate pads 311-313. Note that device 110 is shown as see through, thereby showing the pads of substrate 230. Note also that the electrodes 112-118 on the top surface of device 110 are configured as shown in FIG. 2A. As shown in FIG. 4, pads 311-313 of substrate 230 are formed to extend within the foot-print of device 110. In this way, electrodes 112-118 of the device contact the pads when the device is mounted in the flip-chip orientation. According to this embodiment of the invention, first and second power electrodes 112 and 114 of device 110 contact pads 313 and 311, respectively, and second gate electrode 118 contacts pad 312. In addition, first gate electrode 116 also contacts pad 313 and as such, is electrically connected to first power electrode 112. As shown in FIG. 4, the pads that receive the power electrodes of device 110 (e.g., pads 311 and 313) are preferably interdigitated in shape to conform to the interdigitated shape of the power electrodes.

Electrodes 112-118 of device 110 may be connected to pads 311-313 using an electrically conductive adhesive. As an example, conductive balls may be bumped on device 110 to ready the device for flip-chip mounting. The conductive balls may be formed of gold, copper, lead free solder, or any suitable conductive adhesive or combination of the above. For example, the bumps may be formed of copper with a solderable finish. Note that pads 311-313 of substrate 230 may be formed using thin copper of 1 oz. or less for example, in order to provide fine pitch pads. Fine pitch pads may be useful for enabling interconnection between the pads and the electrodes of III-nitride device 110, which electrodes are typically of a small size.

Turning to device 120, according to this embodiment of the invention drain electrode 122 (note shown in the Figure) of the device is mounted to substrate pad 311 using a thermally and electrically conductive adhesive, such as solder or the like, and is thereby electrically connected to second power electrode 114 of device 110. Similarly, source electrode 124 of device 120 may be electrically connected through wire bond 332 to substrate pad 312 and thereby to second gate electrode 118 of device 110.

As further shown in FIG. 4, gate electrode 126 of device 120 may be electrically connected through wire bond 331 to bond pad 216a of terminal lead 216 and source electrode 124 of device 120 may be electrically connected through a single large diameter wire bond 330 to bond pad 215a of terminal lead 215. Similarly, substrate pad 313 may be electrically connected through a single large diameter wire bond 333 to bond pad 220a of terminal lead 220. Note that rather than using a single large diameter wire bond to connect source electrode 124 to terminal lead 215 and to connect substrate pad 313 to terminal lead 220, a plurality of wire bonds may be used. Wire bonds 330-333 may be formed of gold or aluminum, for example. One skilled in the art will recognize that device package 300 is not limited to the electrode-to-terminal lead assignments as shown in FIG. 4 and other configurations may be used without deviating from the scope and spirit of the invention.

As indicated above, according to this embodiment of the invention devices 110 and 120 are interconnected to functionally operate as a single high voltage switch 102. Here, terminal lead 216 may act as the gate lead for switch 102, terminal lead 220 may act as the drain lead for switch 102, and terminal lead 215 may act as the source lead for switch 102.

According to another embodiment of the invention, rather than mounting device 110 to substrate 230 in a flip-chip orientation, the device may be mounted with its active area facing upward. In this configuration, the electrodes of device 110 may connected to the substrate pads, terminal leads, and/or electrodes of device 110 using wire bonds.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device package comprising:
   a first power semiconductor device having a first power electrode and a second power electrode on one surface thereof, and a second power semiconductor device having a gate electrode and a source electrode on one surface thereof and a drain electrode on another surface thereof, wherein electrodes of said first and second power semiconductor devices are interconnected to form a circuit, and wherein said first power semiconductor device is a III-nitride based semiconductor device;
   a lead frame including a die pad, a first lead, a second lead, and a third lead;
   an electrically insulating body disposed on said die pad and having said first power semiconductor device disposed thereon; and
   a protective housing enclosing at least said first and second power semiconductor devices, and at least a portion of said die pad, wherein said gate electrode is electrically connected to said first lead, said source electrode is electrically connected to said second lead, said drain electrode is electrically connected to said first power electrode, and said second power electrode is electrically connected to said third lead.

2. The semiconductor device package of claim 1, wherein said first power semiconductor device is a GaN-based device.

3. The semiconductor device package of claim 1, wherein said second power semiconductor device is a silicon-based device.

4. The semiconductor device package of claim 1, wherein said electrically insulating body is a ceramic tile.

5. The semiconductor device package of claim 1, wherein said package conforms to a TO package format.

6. The semiconductor device package of claim 1, wherein said drain electrode of said second power semiconductor device is electrically connected to said die pad and said first power electrode is electrically connected to said die pad, whereby said drain electrode and said first power electrode are electrically connected through said die pad.

7. The semiconductor device package of claim 1, wherein said first and second power semiconductor devices are switching devices interconnected to operate as a high voltage switch, with said gate electrode of said second power semiconductor device being a gate electrode of said high voltage switch, said source electrode of said second power semiconductor device being a source electrode of said high voltage switch, and said second power electrode of said first power semiconductor device being a drain electrode of said high voltage switch.

8. The semiconductor device package of claim 1, wherein said first power semiconductor device is a bi-directional switch with first and second gate electrodes; and
   wherein said second power semiconductor device is a uni-directional switch.

9. The semiconductor device package of claim 8, wherein said first gate electrode and said first power electrode of said first power semiconductor device are electrically connected; and
   wherein said second gate electrode of said first power semiconductor device is electrically connected to said source electrode of said second power semiconductor device.

10. The semiconductor device package of claim 1, wherein said first power electrode of said first power semiconductor device is electrically connected to said die paid with wire bonds and said drain electrode of said second power semiconductor device is electrically connected to said die pad through an electrically conductive adhesive.

11. A semiconductor device package comprising:
    a lead frame including a first lead, a second lead, and a third lead;
    a substrate having a first major surface, a first conductive pad and a second conductive pad disposed on said first major surface;
    a III-nitride based power semiconductor device having a first power electrode and a second power electrode on a surface thereof;
    a second power semiconductor device having a gate electrode, a source electrode, and a drain electrode electrically connected to said first power electrode; and
    a protective housing enclosing at least said III-nitride based power semiconductor device,
    wherein said first power electrode is electrically connected to said first conductive pad and said second power electrode is electrically connected to said second conductive pad, said gate electrode is electrically connected to said first lead, said source electrode is electrically connected to said second lead, and said second conductive pad is electrically connected to said third lead.

12. The semiconductor device package of claim 11, wherein electrodes of said III-nitride based power semiconductor device and said second power semiconductor device are interconnected such that said III-nitride based power semiconductor device and said second power semiconductor device operate as a high voltage switch.

* * * * *